(12) United States Patent
De La Cruz et al.

(10) Patent No.: US 7,765,518 B2
(45) Date of Patent: Jul. 27, 2010

(54) SYSTEM AND METHOD FOR IMPLEMENTING OPTICAL RULE CHECKING TO IDENTIFY AND QUANTIFY CORNER ROUNDING ERRORS

(75) Inventors: Ramon E De La Cruz, Poughkeepsie, NY (US); Yea-Sen Lin, LaGrangeville, NY (US); Alexander C Wei, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 301 days.

(21) Appl. No.: 12/052,044

(22) Filed: Mar. 20, 2008

(65) Prior Publication Data

US 2009/0241085 A1 Sep. 24, 2009

(51) Int. Cl.
*G06F 17/50* (2006.01)

(52) U.S. Cl. .................. 716/19; 716/4; 716/5; 716/20; 716/21; 382/144; 702/157

(58) Field of Classification Search ................. 716/4–5, 716/19–21; 382/144; 702/157
See application file for complete search history.

(56) References Cited

U.S. PATENT DOCUMENTS

| | | | | |
|---|---|---|---|---|
| 5,475,766 A * | 12/1995 | Tsuchiya et al. | ............. | 382/144 |
| 5,801,954 A | 9/1998 | Le et al. | | |
| 6,263,299 B1 * | 7/2001 | Aleshin et al. | .................. | 703/5 |
| 6,280,887 B1 * | 8/2001 | Lu | ................................ | 430/5 |
| 6,311,319 B1 | 10/2001 | Tu et al. | | |
| 6,397,165 B1 * | 5/2002 | Fiekowsky | ................... | 702/157 |
| 6,536,032 B1 * | 3/2003 | Tanaka et al. | .................. | 716/21 |
| 6,834,262 B1 * | 12/2004 | Balasinski et al. | ............. | 703/13 |
| 6,892,365 B2 * | 5/2005 | Culp et al. | ..................... | 716/4 |
| 6,901,569 B2 | 5/2005 | Aoki | | |
| 7,191,428 B2 | 3/2007 | Tang et al. | | |
| 7,366,342 B2 * | 4/2008 | Gallatin et al. | .............. | 382/144 |
| 2004/0006758 A1 | 1/2004 | Aoki | | |
| 2005/0229125 A1 | 10/2005 | Tabery et al. | | |
| 2005/0280800 A1 * | 12/2005 | Laiding et al. | ................. | 355/77 |
| 2006/0006154 A1 | 1/2006 | Koike et al. | | |
| 2006/0271906 A1 | 11/2006 | Tang et al. | | |
| 2007/0083847 A1 | 4/2007 | Mansfield et al. | | |
| 2008/0184189 A1 * | 7/2008 | Rosenbluth | ................... | 716/19 |
| 2008/0212869 A1 * | 9/2008 | Yoshikawa et al. | .......... | 382/144 |

* cited by examiner

*Primary Examiner*—Naum B Levin
(74) *Attorney, Agent, or Firm*—Cantor Colburn LLP; Daniel Schnurmann

(57) ABSTRACT

A method for implementing optical rule checking to identify and quantify corner rounding errors includes receiving corner rounding data based on established ground rules; determining a simulated shape for a semiconductor device feature produced on a wafer, the simulated shape based on a designed shape for the semiconductor device feature; selecting a corner feature associated with the designed shape, and drawing one or more triangles at the selected corner feature. For each triangle, the presence or absence of an intersection between the triangle and the simulated shape is determined, wherein a degree of corner rounding is determined by a pair of successively sized triangles for which one of the pair intersects with the simulated shape and the other does not; and comparing the determined corner rounding with the corner rounding data for the designed shape to determine whether the simulated shape results in a rule violation.

21 Claims, 12 Drawing Sheets

SYSTEM AND METHOD FOR IMPLEMENTING OPTICAL RULE CHECKING TO IDENTIFY AND QUANTIFY CORNER ROUNDING ERRORS

BACKGROUND

The present invention relates generally to integrated circuit device fabrication techniques and, more particularly, to system and method for implementing optical rule checking to identify and quantify corner rounding errors.

In designing an integrated circuit (IC) device, engineers or designers typically rely on computer design tools to help create an IC schematic or design, which can include a multitude of individual devices, such as transistors, coupled together to perform a certain function. To actually fabricate the IC device in or on a semiconductor substrate, the IC device schematic must be translated into a physical representation or layout, which itself can then be transferred onto a semiconductor substrate. Computer aided design (CAD) tools can be used to assist layout designers with translating the discrete circuit elements into shapes, which will embody the devices themselves in the completed IC device. These shapes make up the individual components of the circuit, such as gate electrodes, diffusion regions, metal interconnects and the like.

The software programs employed by the CAD systems to produce layout representations are typically structured to function under a set of predetermined design rules in order to produce a functional circuit. Often, the design rules are determined by certain processing and design limitations based roughly on the patternability of layout designs. For example, design rules may define the space tolerance between devices or interconnect lines. Once the layout of the circuit has been created, the next step in manufacturing the IC device is to transfer the layout onto a semiconductor substrate. Optical lithography or photolithography is a well-known process for transferring geometric shapes onto the surface on a semiconductor wafer. The photolithography process generally begins with the formation of a photoresist layer on the top surface of a semiconductor substrate or wafer. A reticle or mask having fully light non-transmissive opaque regions (which are often formed of chrome) and fully light transmissive clear regions (which are often formed of quartz) is then positioned over the photoresist coated wafer.

The mask is placed between a radiation or light source, which can produce light of a pre-selected wavelength (e.g., ultraviolet light) and geometry, and an optical lens system, which may form part of a stepper apparatus. When the light from the light source is directed onto the mask, the light is focused to generate a reduced mask image on the wafer, typically using the optical lens system, which may contain one or several lenses, filters, and/or mirrors. This light passes through the clear regions of the mask to expose the underlying photoresist layer, and is blocked by the opaque regions of the mask, leaving that underlying portion of the photoresist layer unexposed. The exposed photoresist layer is then developed, typically through chemical removal of the exposed or unexposed regions of the photoresist layer. The end result is a semiconductor wafer coated with a photoresist layer exhibiting a desired pattern, which defines the geometries, features, lines and shapes of that layer. This pattern can then be used for etching underlying regions of the wafer.

However, as desired wafer level scaling continues to occur at a pace faster than corresponding improvements in lithographic equipment, patterning solutions based on decreasing image resolution have been developed. For example, one technique that is used to help ease the burden placed on the lithographer is to restrict the variety of patterns that can be printed on any given level. This allows the lithography process to be more easily optimized. Unfortunately, this use of restricted design rules just transfers the burden from the lithographer to the designer, who now is left with the difficult task of redesigning layouts in a very restricted environment. Since it is very difficult for the lithographer to predict what design geometries they may be asked to print and to know how well each geometry will print on the wafer, the lithographer will often attempt to impose severe restrictions on the designer so as to ensure that the relatively small variety of patterns will all print with sufficient process latitude.

Accordingly, optical proximity correction (OPC) is a photolithography enhancement technique commonly used to compensate for image errors due to diffraction or process effects. The two most common applications for OPC are linewidth differences between features in regions of different density (e.g., center vs. edge of an array, or nested vs. isolated lines), and line end shortening (e.g., gate overlap on field oxide). For the former case, scattering bars (sub-resolution lines placed adjacent to resolvable lines) or simple linewidth adjustments are applied to the design. For the latter case, "dog-ear" (serif or hammerhead) features are attached to the line end in the design. OPC has a cost impact on photomask fabrication, as the addition of OPC features means more spots for defects to manifest themselves. In addition, the data size of the photomask layout goes up exponentially.

However, even with OPC, there is still a tendency for corners to round such that an expected shape can vary from the designed shape. In cases where such rounding would violate a design rule that a second layer must not overlap a first layer, there is no methodology that can verify whether expected corner rounding does not exceed a specified amount so as to violate the design rule.

SUMMARY

The foregoing discussed drawbacks and deficiencies of the prior art are overcome or alleviated, in an exemplary embodiment, by a method for implementing optical rule checking (ORC) to identify and quantify corner rounding errors, the method including receiving ORC corner rounding data based on established ground rules; determining a simulated shape for a semiconductor device feature produced on a wafer, the simulated shape based on a designed shape for the semiconductor device feature; selecting a corner feature associated with the designed shape, and drawing one or more triangles at the selected corner feature; for each drawn triangle, determining the presence or absence of an intersection between the triangle and the simulated shape, wherein a degree of corner rounding is determined by a pair of successively sized triangles for which one of the pair intersects with the simulated shape and the other of the pair does not intersect with the simulated shape; and comparing the determined corner rounding with the ground rule based ORC corner rounding data for the designed shape to determine whether the simulated shape results in a corner rounding rule violation.

In another embodiment, a computer program product includes a computer readable computer program code for implementing optical rule checking (ORC) to identify and quantify corner rounding errors; and instructions for causing a computer to implement a method, the method further including receiving ORC corner rounding data based on established ground rules; determining a simulated shape for a semiconductor device feature produced on a wafer, the simulated shape based on a designed shape for the semiconductor device feature; selecting a corner feature associated with the designed shape, and drawing one or more triangles at the selected corner feature; for each drawn triangle, determining the presence or absence of an intersection between the triangle and the simulated shape, wherein a degree of corner rounding is determined by a pair of successively sized triangles for which one of the pair intersects with the simulated shape and the other of the pair does not intersect with the simulated shape; and comparing the determined corner rounding with the ground rule based ORC corner rounding data for the designed shape to determine whether the simulated shape results in a corner rounding rule violation.

A system for implementing optical rule checking (ORC) to identify and quantify corner rounding errors includes a computing network including a processing device in communication with one or more computer memory storage devices; and the computing network further configured to implement a method for optical rule checking (ORC) to identify and quantify corner rounding errors, the method further including receiving ORC corner rounding data based on established ground rules; determining a simulated shape for a semiconductor device feature produced on a wafer, the simulated shape based on a designed shape for the semiconductor device feature; selecting a corner feature associated with the designed shape, and drawing one or more triangles at the selected corner feature; for each drawn triangle, determining the presence or absence of an intersection between the triangle and the simulated shape, wherein a degree of corner rounding is determined by a pair of successively sized triangles for which one of the pair intersects with the simulated shape and the other of the pair does not intersect with the simulated shape; and comparing the determined corner rounding with the ground rule based ORC corner rounding data for the designed shape to determine whether the simulated shape results in a corner rounding rule violation.

BRIEF DESCRIPTION OF THE DRAWINGS

Referring to the exemplary drawings wherein like elements are numbered alike in the several Figures.

DETAILED DESCRIPTION

Disclosed herein is a system and method for implementing optical rule checking to identify and quantify corner rounding errors. Briefly stated, failure criteria are determined for corner rounding based on a set of design ground rules. Beginning at a corner of a designed shape, triangular areas are drawn at successively larger/smaller sizes until a pair of successively sized triangles is found in which one drawn triangle intersects the simulated shape, and the next smaller/larger triangle does not intersect the simulated shape. Based on the geometry of the two triangles, a representative number for the corner rounding may be derived. This number is then compared to the determined failure criteria derived from the ORC ground rules. If the calculated corner rounding is determined to exceed the maximum allowed rounding based on the ORC ground rules then it will be flagged as an error and the extent to which it exceeds the rounding may be quantified.

Figure 1:
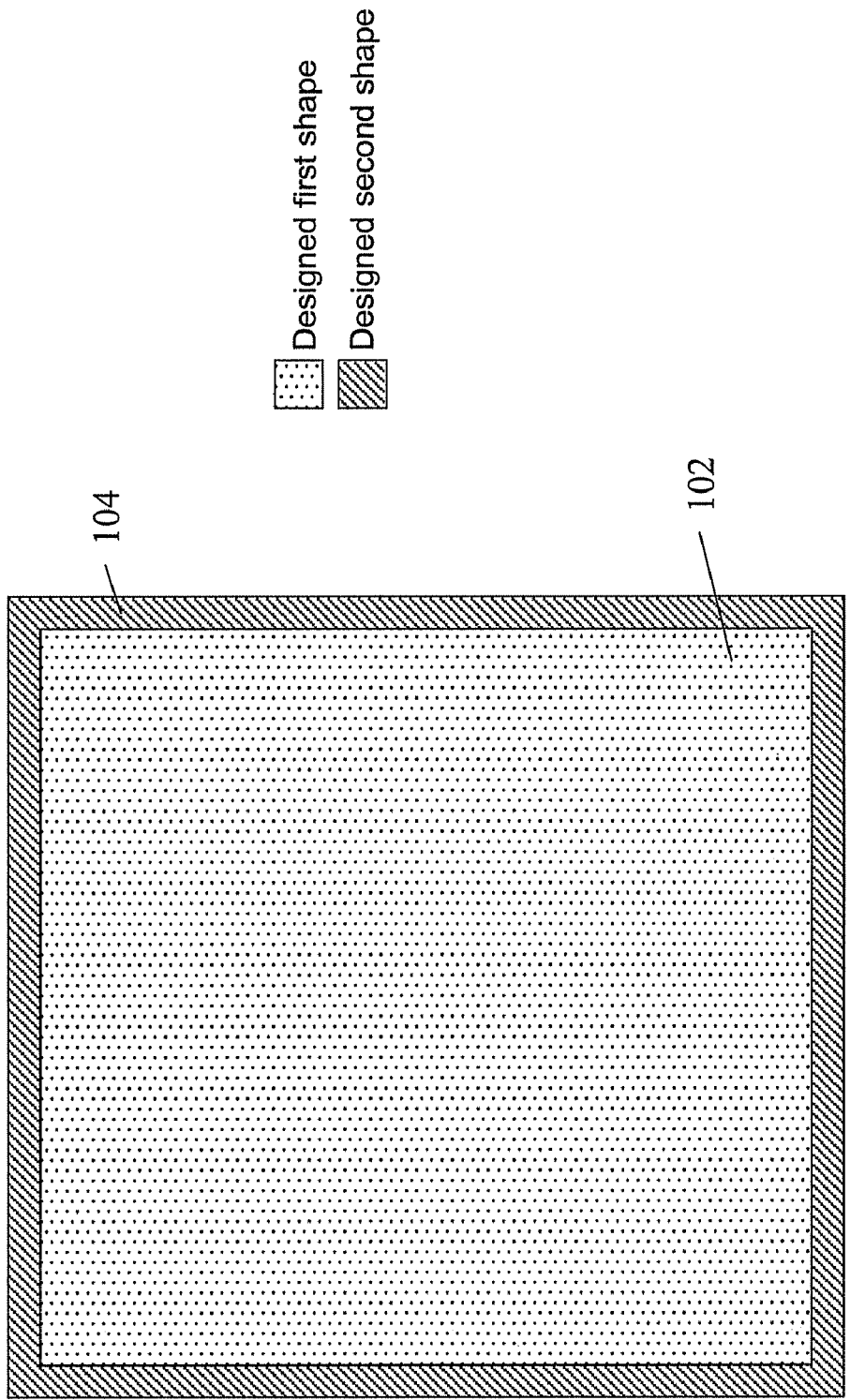
FIG. 1 is a schematic diagram of a pair of exemplary first and second design features of a semiconductor device illustrating a desired geometric relationship therebetween.

Referring initially to FIG. 1, there is shown a schematic diagram of a pair of exemplary first and second design features of a semiconductor device illustrating a desired geometric relationship therebetween. In particular, FIG. 1 illustrates a first design shape 102 and a second design shape 104 wherein a design ground rule specifies that the outer border of the first design shape 102 must not overlap with the second design shape. Such may be the case, for example, where the second design shape 104 is formed above the first design shape 102 in a semiconductor device such that the second design shape 104 has to completely cover the first design shape 102.

Figure 2:
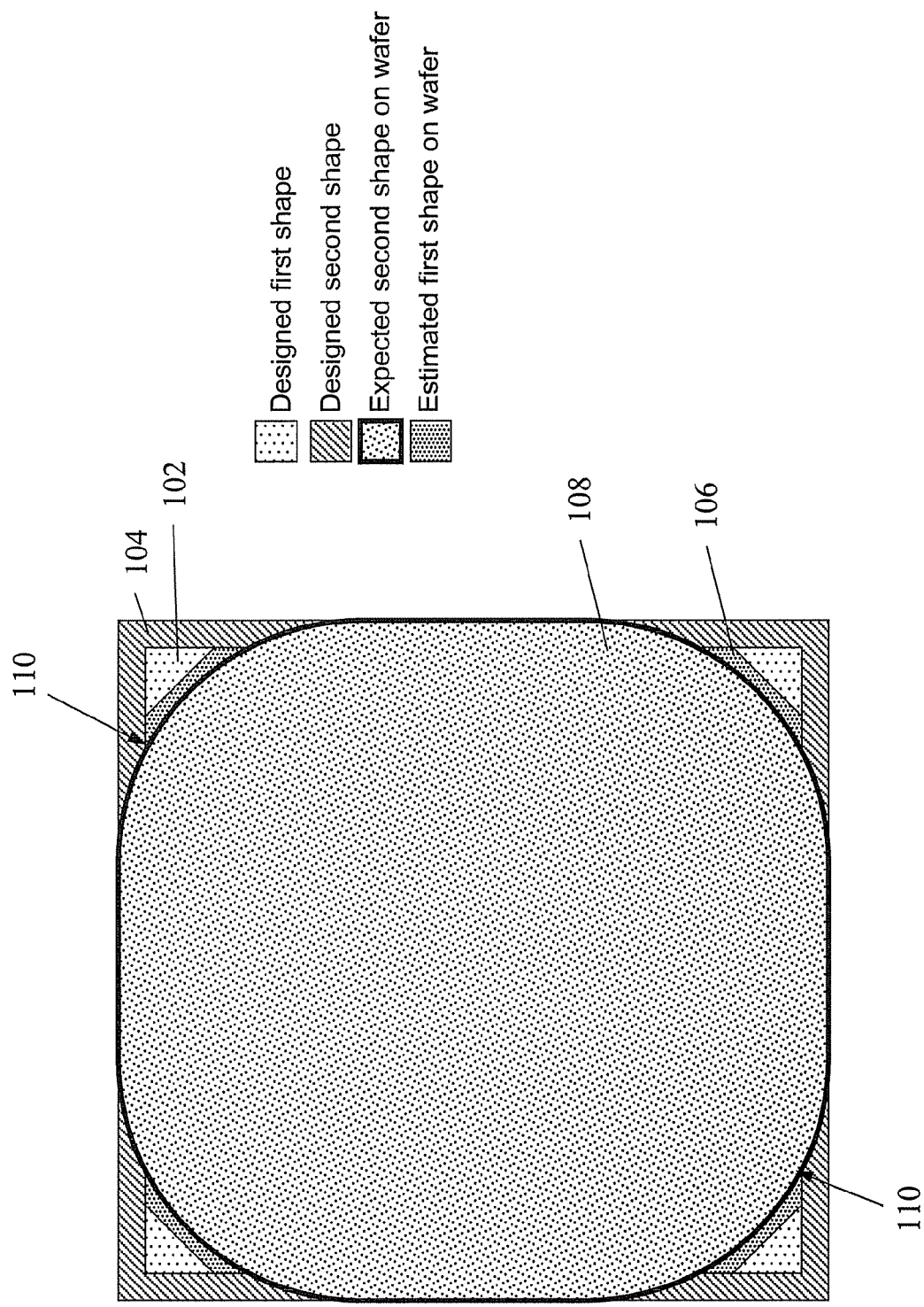
FIG. 2 is a schematic diagram illustrating a ground rule violation of the expected second design shape with respect to the estimated first design shape of FIG. 1, due to excessive corner rounding.

However, as shown in FIG. 2, the practicalities of corner rounding during actual semiconductor manufacturing process may result in a situation where the expected shape of the second design shape 104 (due to excessive corner rounding) violates the design rule that the outer borders of the expected shape of second design shape 104 do not overlap with the outer borders of the estimated shape of first design shape 102. More specifically, it will be seen that the estimated first shape on the wafer (designated by 106) has some rounding with respect to the first design shape 102. In addition, the corner rounding of the expected second design shape on the wafer (designated by 108) is excessive in that portions of the outer border the expected second design shape 108 overlap portions of the outer border of the estimated first shape 106, such as shown at locations 110.

Figure 3:
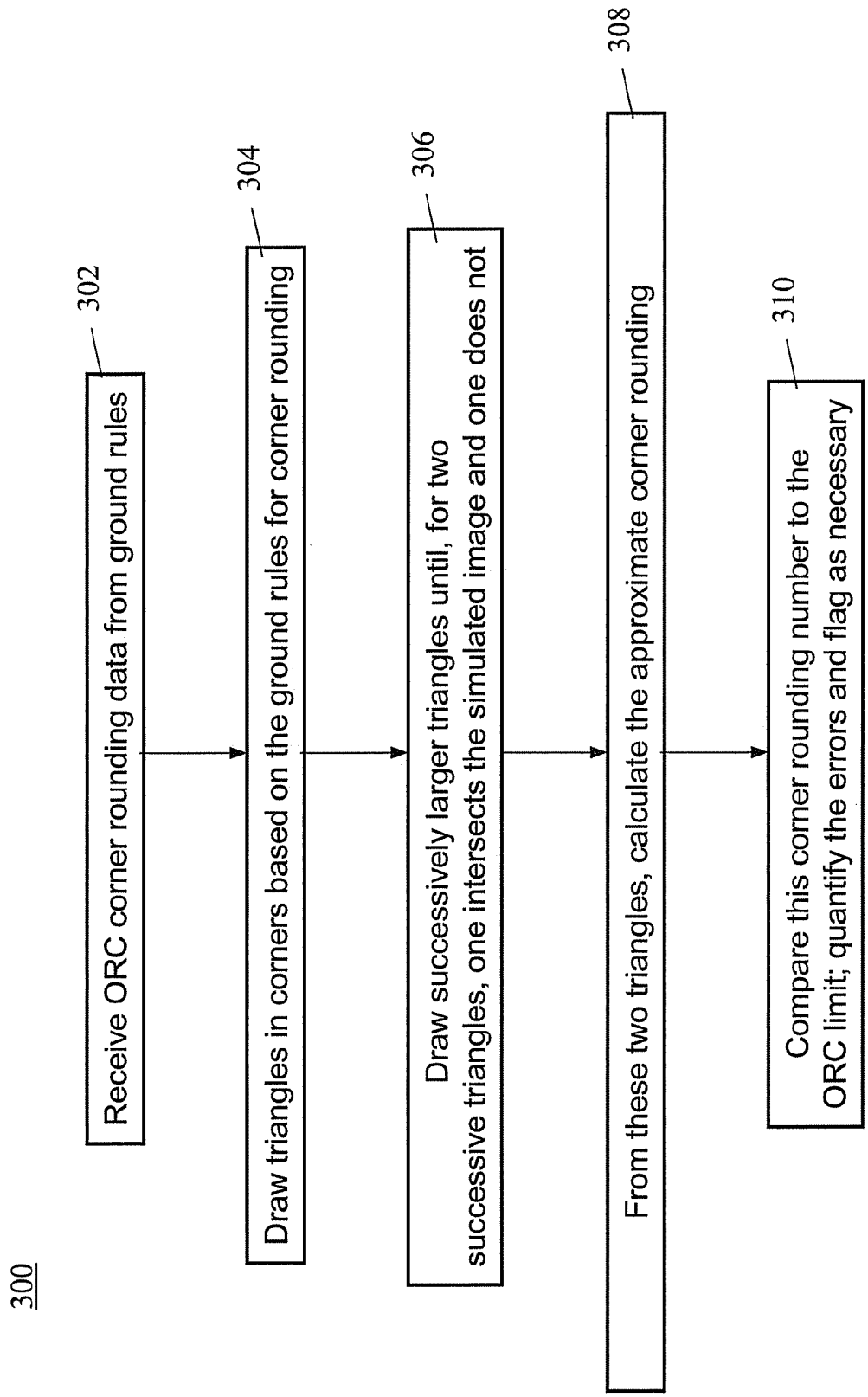
FIG. 3 is block diagram that depicts a high-level methodology for implementing optical rule checking to identify and quantify corner rounding errors, in accordance with an embodiment of the invention.

Accordingly, FIG. 3 is block diagram that depicts a high-level methodology 300 for implementing optical rule checking to identify and quantify corner rounding errors, in accordance with an embodiment of the invention. As shown in block 302, ORC corner rounding data is received based on the ground rules of the semiconductor device design. The corner rounding data determines, based on the ground rules, maximum allowable corner rounding for a given feature. Then, as shown in block 304, triangles are drawn in a corner corresponding to a location where corner rounding is to be checked. As reflected in block 306, successive triangles at increasing/decreasing sizes are drawn until there comes a point at which the hypotenuse of one of the triangles intersects the design feature checked for corner rounding while the hypotenuse of the next largest (or next smallest) triangle does not intersect the design feature. Once two such triangles are determined, the approximate degree of corner rounding for the checked feature can be quantitatively calculated. In block 310, the calculated corner rounding value is quantified compared with the determined maximum corner rounding value. If it exceeds this value, then ORC would flag the expected shape of the feature as an error.

Figure 4:
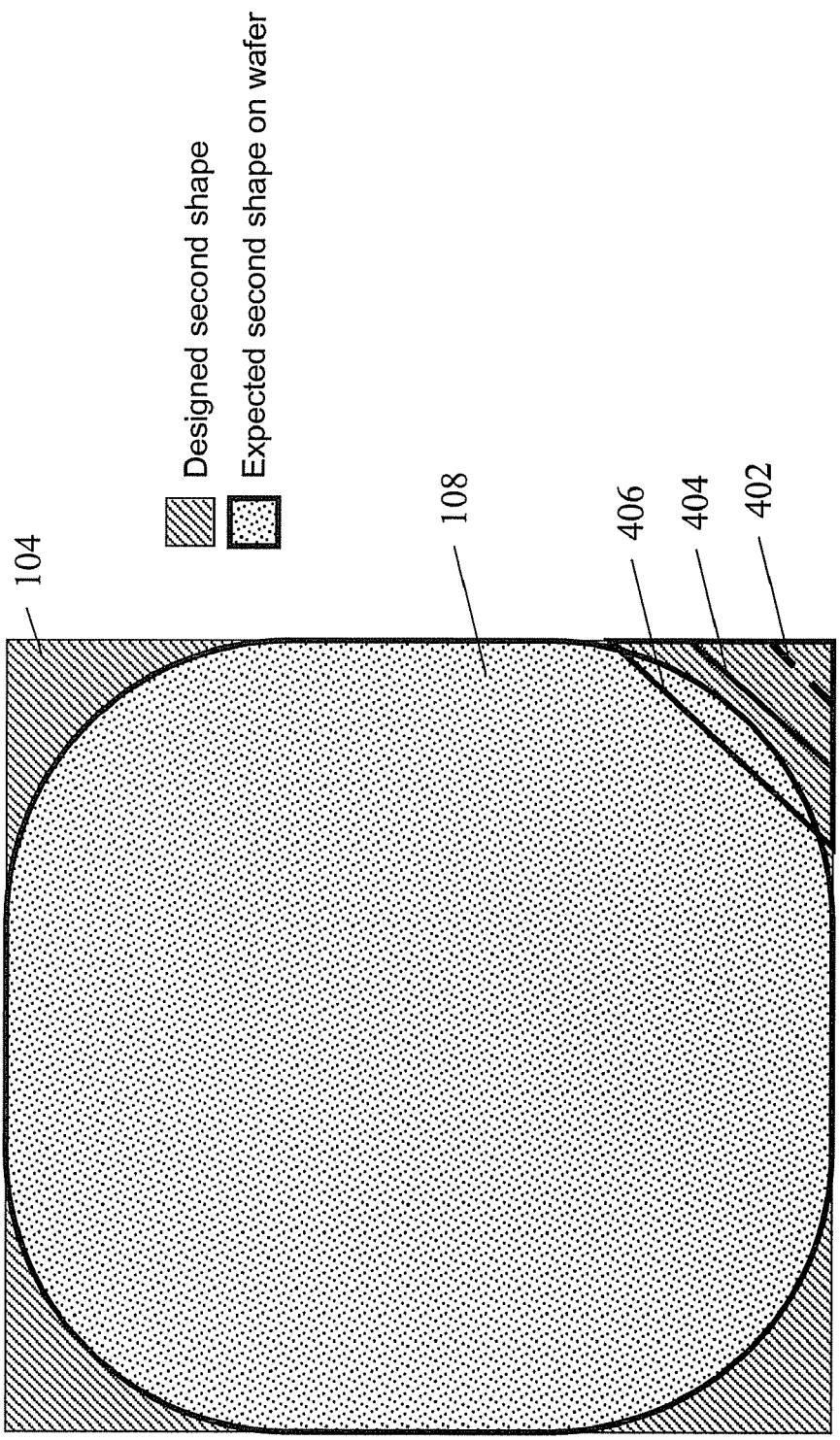
FIGS. 4 and 5 are schematic diagrams graphically depicting an exemplary application of the general methodology of FIG. 3, using the designed and expected second shapes illustrated in FIGS. 1 and 2.
Figure 5:
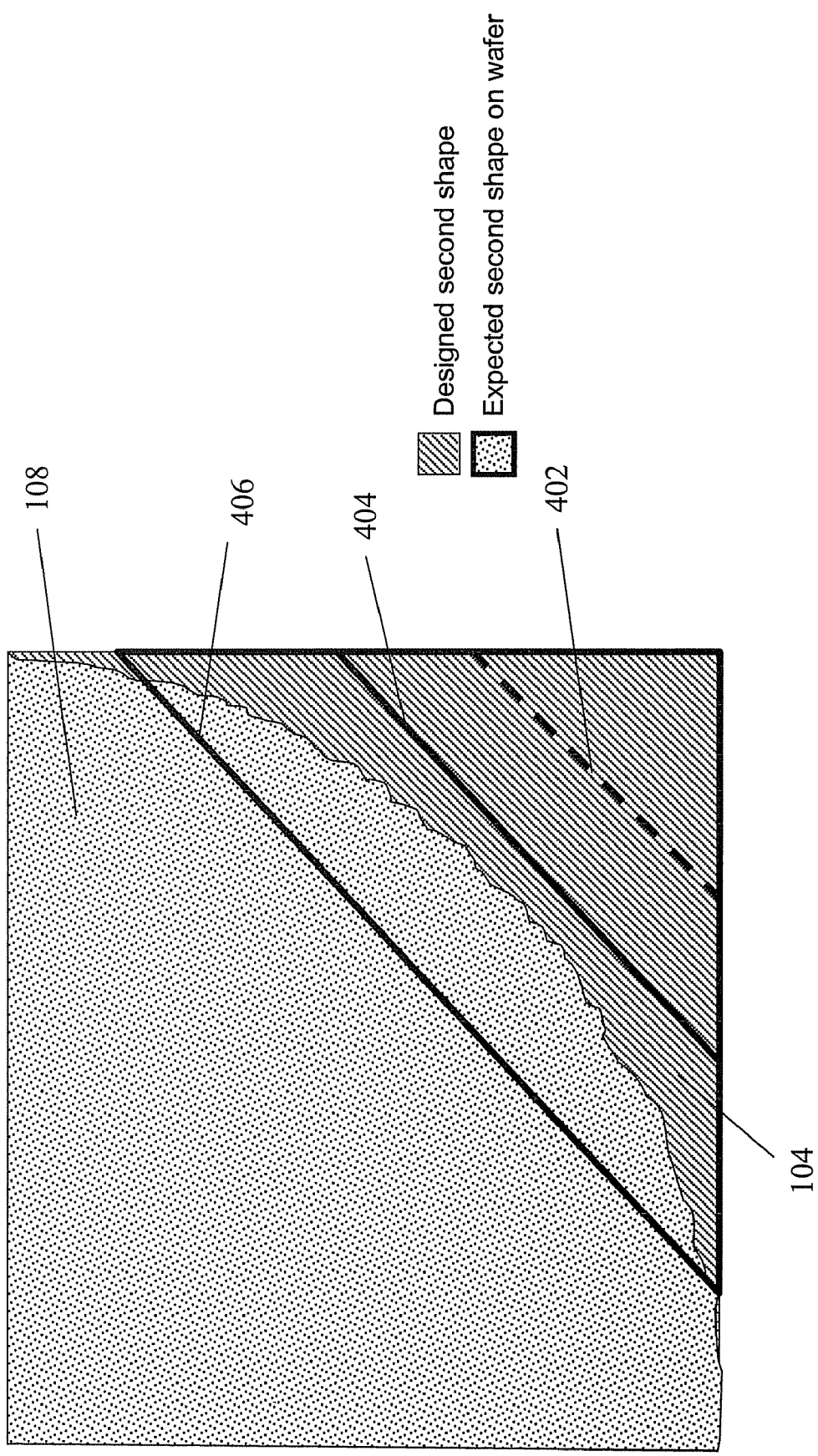

FIGS. 4 and 5 graphically depict an exemplary application of the general methodology 300 of FIG. 3, using the designed and expected second shapes illustrated in FIGS. 1 and 2. As shown in the lower right portion of FIG. 4 (and more particularly in the enlarged corner view of FIG. 5), the dashed triangle 402 represents the determined maximum corner rounding. Triangle 404 represents a larger triangle with respect to the maximum corner rounding triangle 402; however, triangle 404 does not intersect with any part of the outer border of the expected (simulated) second shape 108. This, by itself, is indicative that there is a corner rounding error. However, the extent of the corner rounding error is not known until determining another triangle 406 (next in succession with respect to triangle 404) that does intersect the simulated second shape 108.

It will be appreciated that the size interval between successive triangles may be selected in accordance with a desired granularity of the determined corner rounding measurement, as well as processing time and resources used in determine the corner rounding. Moreover, the direction of the triangle size increments can be either increasing or decreasing, depending on the specific approach used, as will be described in further detail below.

Figure 6:
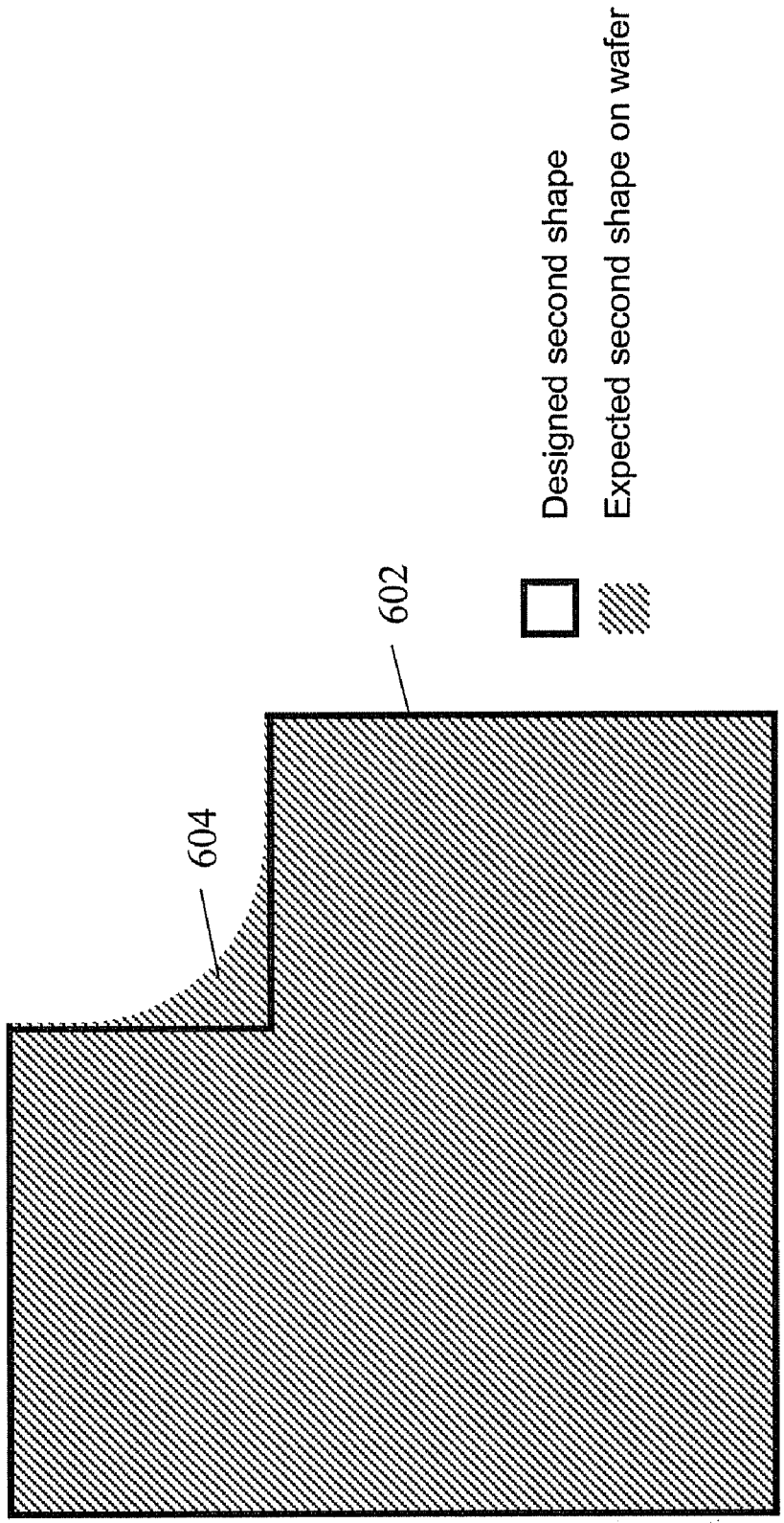
FIGS. 6 through 9 are schematic diagrams of a design shape with a interior corner feature.
Figure 7:
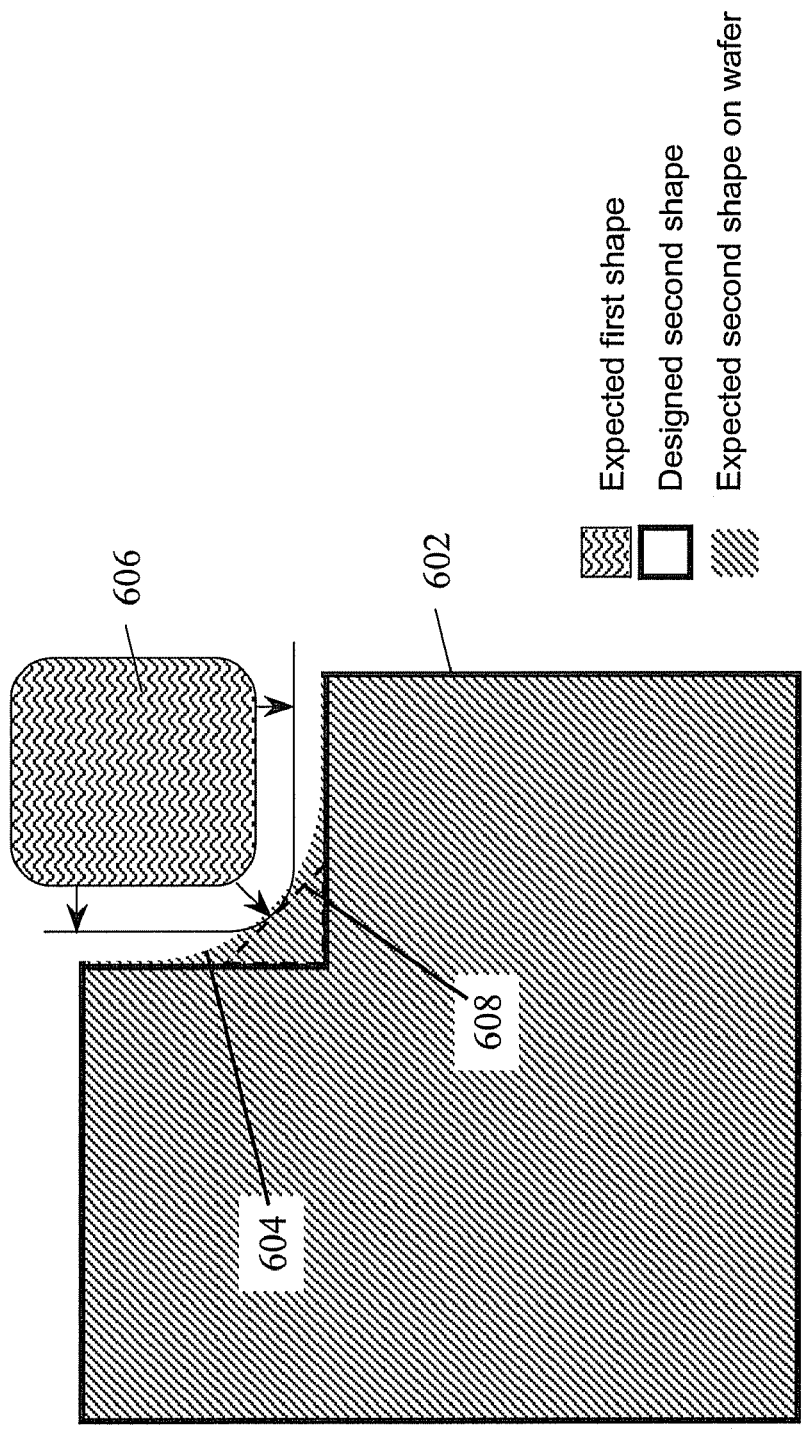

In addition to exterior or convex corner rounding identification, the same methodology can also be applied to identification of interior or concave corner rounding errors. For instance, FIG. 6 is a schematic diagram of a design shape 602 with an interior corner feature. The expected shape 604 is characterized by corner rounding such that for an interior corner, the resulting area of the shape due to rounding is actually larger than the designed area. With respect to another design feature (e.g., an expected first shape 606) as shown in FIG. 7, the triangle 608 represents the maximum allowable corner rounding. In this example, the ground rule is that there must be a minimum separation distance between the expected first shape 606 and the expected second shape 604. Thus, because the edge of the expected second shape 604 is in borderline contact with the hypotenuse of the triangle 608, FIG. 7 represents a failed corner rounding case.

Figure 8:
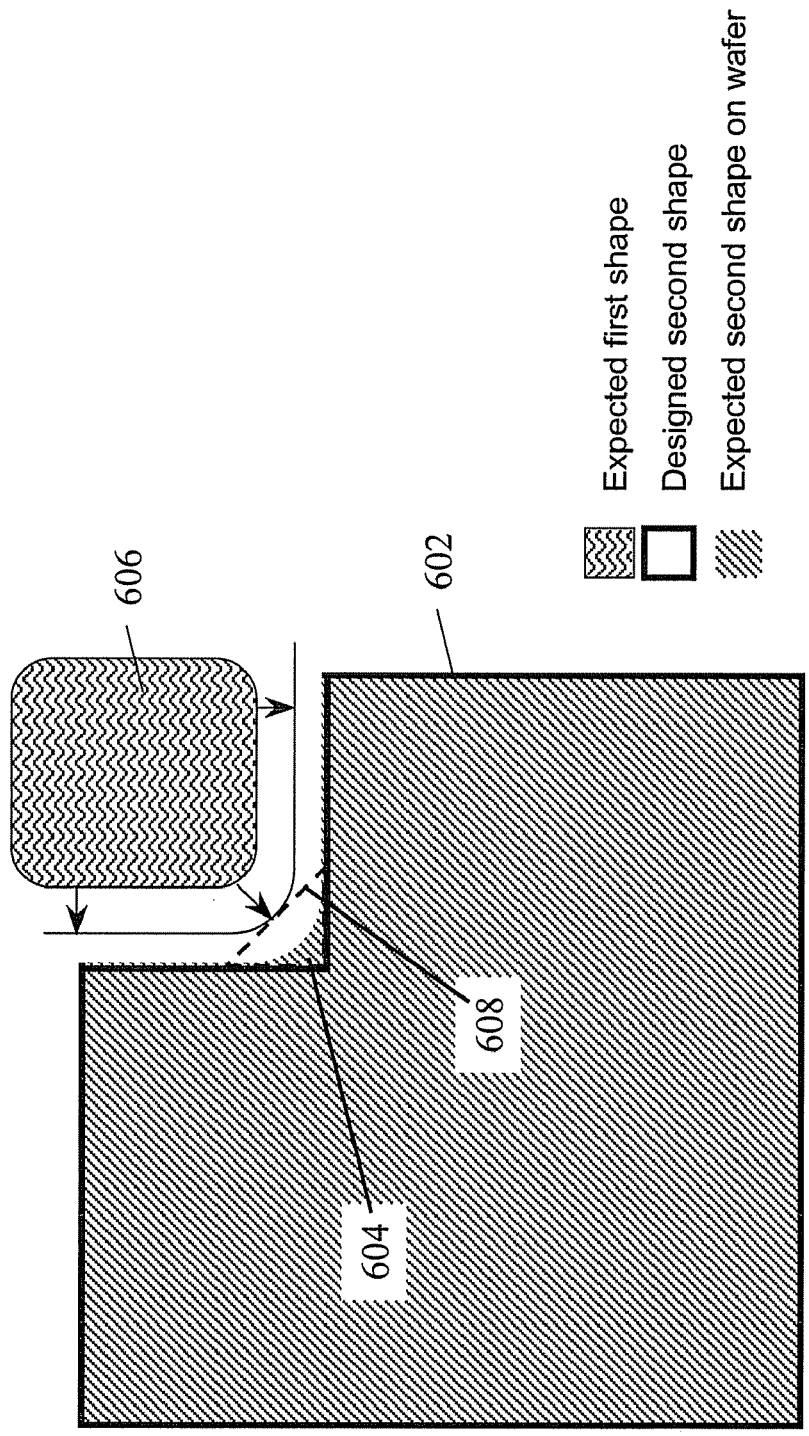

By way of comparison, FIG. 8 represents a "pass" case where the corner rounding is within acceptable limits with respect to the applicable ground rule, since there is no intersection of the hypotenuse of the triangle 608 with the expected second shape 604, and thus the expected second shape 604 is not projected to be in contact with the expected first shape 606. It will be noted that the opposition condition is true with respect to an exterior or convex corner; that is, when the hypotenuse of the maximum corner rounding triangle (e.g., triangle 402 of FIG. 5) does not intersect the expected second shape, then the corner rounding is a "fail" case.

Figure 9:
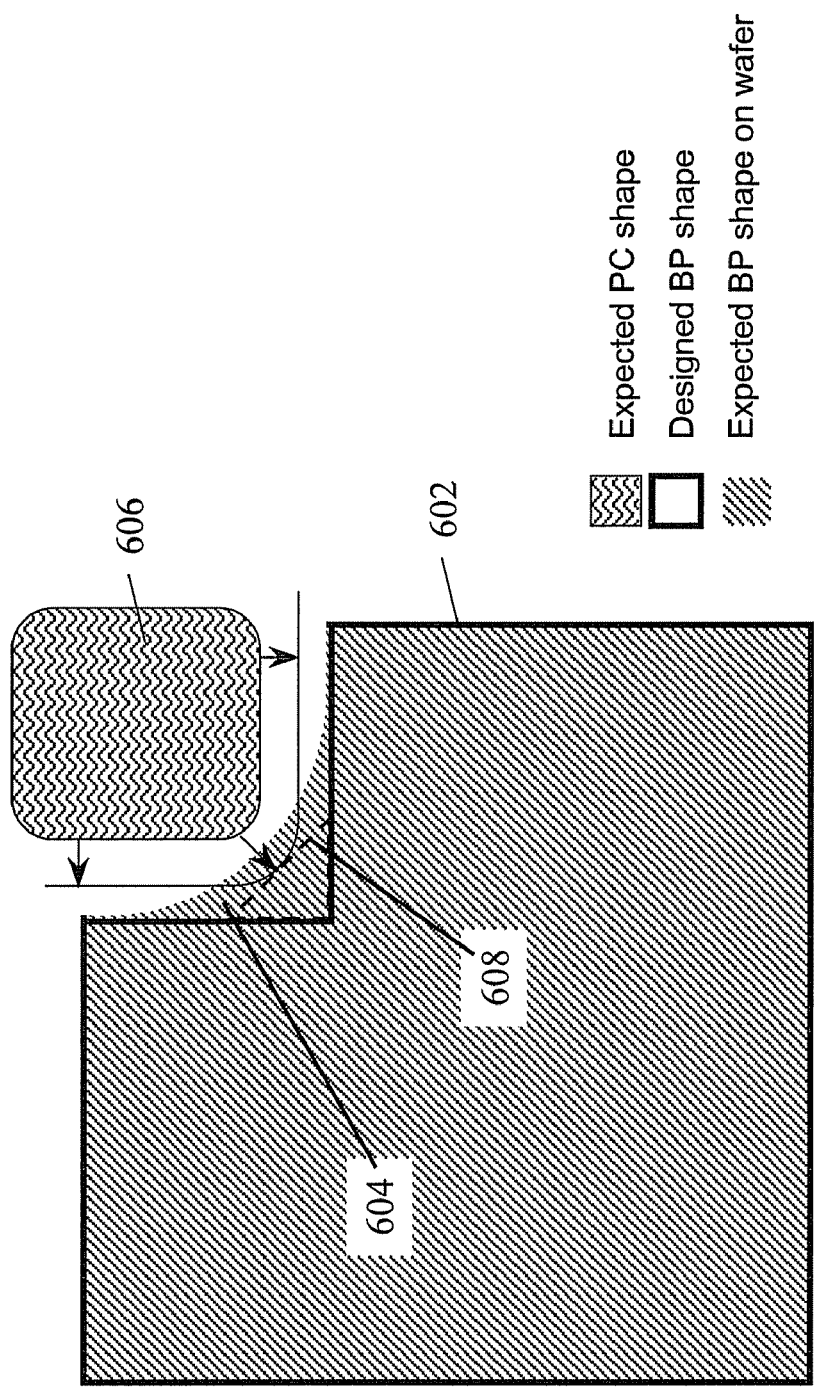

Referring next to FIG. 9, a "fail" case is shown for the concave corner rounding as the hypotenuse of the triangle 608 with the expected second shape 604, and thus the expected second shape 604 is projected to be in contact with the expected first shape 606.

In the generalized process flow 300 depicted in FIG. 3, it is contemplated that with respect to the drawing of the successive triangles, multiple starting points (i.e., initial sizes) for the first of such triangles may utilized. For example, the first triangle could be drawn as small as practically possible, and successively increased until intersection is achieved. At that point, it could be determined whether the determining rounding represents a pass or fail condition, followed by quantification of the rounding. Alternatively, the starting triangle could correspond to the maximum allowable rounding and thus the pass/fail condition will be immediately known. The degree of pass or fail will then be determined on finding a pair of successively sized triangles that result in one intersecting the corner shape and the other not.

Figure 10:
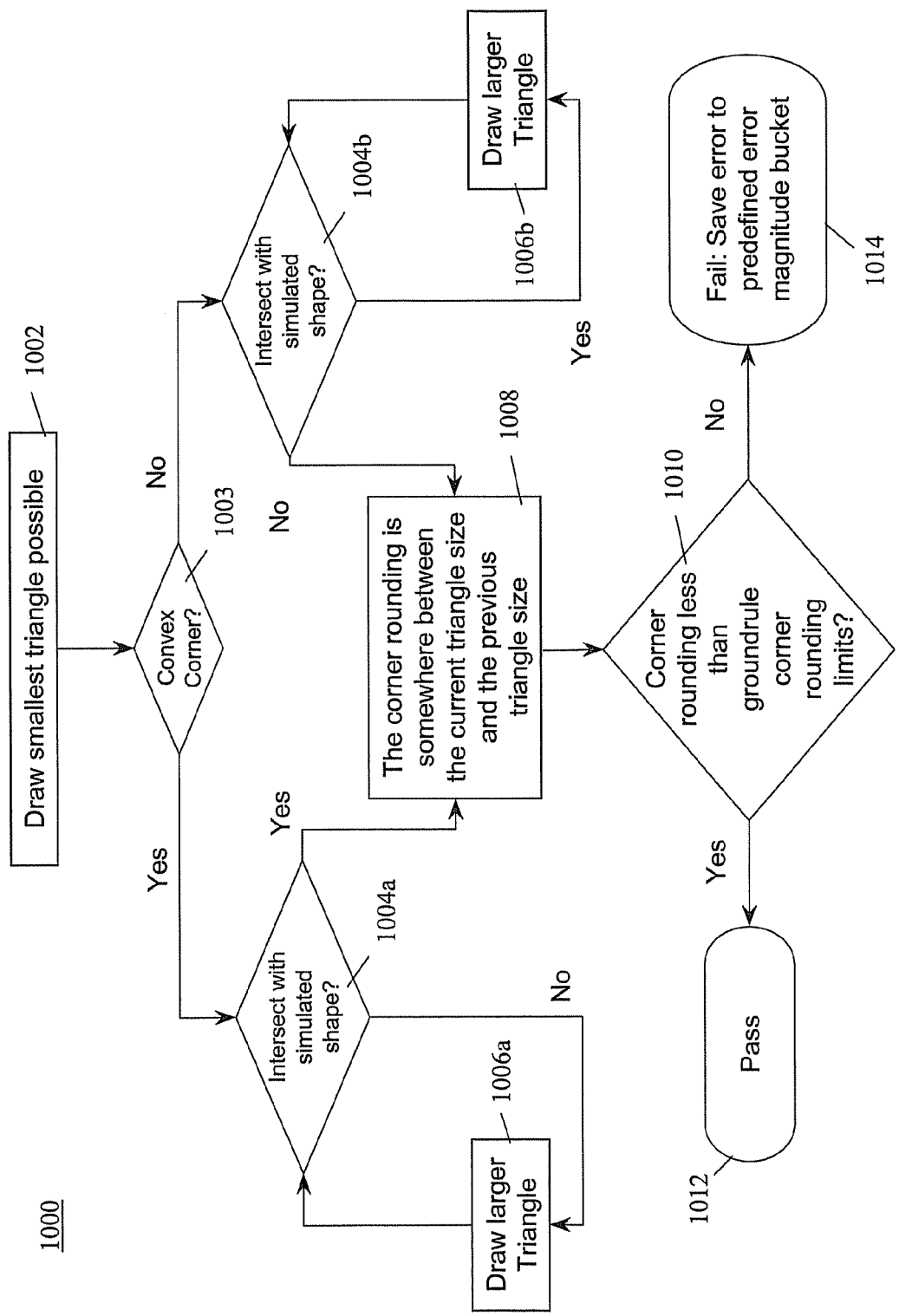
FIG. 10 is a flow diagram that depicts a more detailed methodology for implementing optical rule checking to identify and quantify corner rounding errors, in accordance with a further embodiment of the invention.

FIG. 10 is a flow diagram that depicts a more detailed methodology 1000 for implementing optical rule checking to identify and quantify corner rounding errors, in accordance with a further embodiment of the invention. Beginning in block 1002, a triangle of the smallest definable size (e.g., depending upon process granularity, design dimensions, etc.) is drawn. Depending upon whether the corner is convex or concave as determined at block 1003, the process proceeds to either decision block 1004a or 1004b to determine whether this first smallest shape resulted in an intersection with the simulated shape. In the case of a convex corner, if the first smallest shape did not result in an intersection with the simulated shape, then the process loops back through block 1006a to continue to draw successively larger triangle until such an intersection occurs. Thus, when the result of decision block is 1004a is "yes" the process proceeds to block 1008, at which point it is known that the corner rounding is somewhere between the currently drawn triangle and the previously drawn triangle. In the case where the smallest triangle (block 1002) results in an intersection, then the corner rounding is less than the smallest triangle (which, in practical terms, means that there is substantially no corner rounding at all).

Conversely, for a concave corner, if the first smallest shape did result in an intersection with the simulated shape, then the process loops back through block 1006b to continue to draw successively larger triangle until such an intersection no longer occurs. Thus, when the result of decision block is 1004b is "no" the process proceeds to block 1008, at which point it is known that the corner rounding is somewhere between the currently drawn triangle and the previously drawn triangle. Upon quantifying the corner rounding, the process then proceeds to decision block 1010 to determine whether this quantity represents a pass or a fail condition. That is, decision block 1010 determines whether the corner rounding is less than the ground rule limits. If so, the result is a "pass" as reflected in block 1012, and if not then the result is a "fail" as reflected in block 1014. As also indicated in block 1014, the degree to which the simulated shape violates corner rounding ground rules is quantified or "bucketized," such as in a discrete range, for example.

Figure 11:
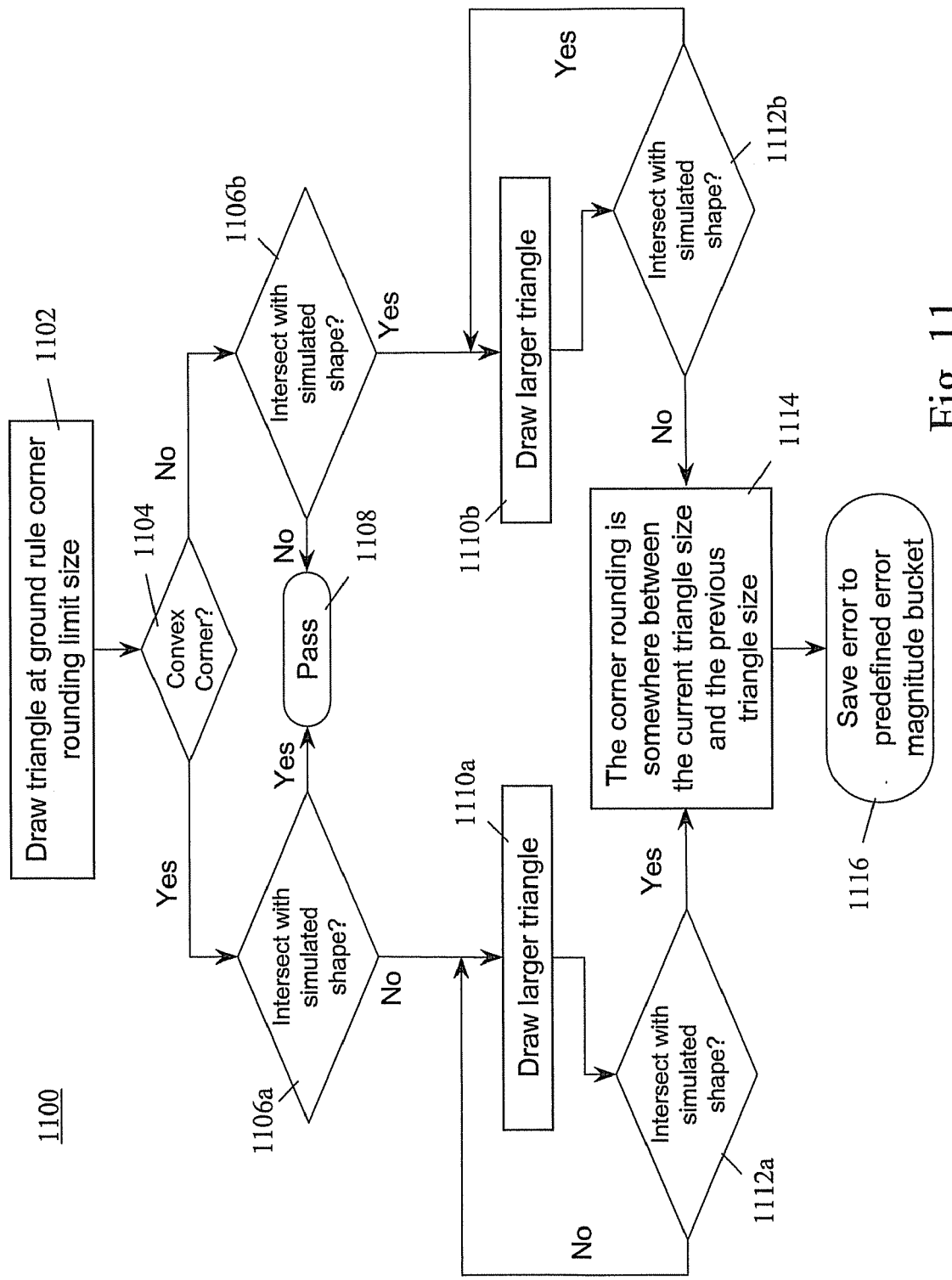
FIG. 11 is a flow diagram that depicts another detailed methodology for implementing optical rule checking to identify and quantify corner rounding errors, in accordance with still a further embodiment of the invention.

As also indicated above, in lieu of first quantifying the degree of corner rounding, followed by determining whether this rounding represents a pass/fail condition, the reverse may be implemented. For example, FIG. 11 is a flow diagram that depicts another detailed methodology 1000 for implementing optical rule checking to identify and quantify corner rounding errors, in accordance with still a further embodiment of the invention. Beginning in block 1102, a triangle is drawn, which represents a size corresponding to the ground rule limit for the corner rounding of the feature. At decision block 1104, it is determined whether the corner feature being checked is concave or convex. In either instance, it will be known whether the there is a pass or fail condition after the first triangle, as reflected in decision block 1106a or 1106b. In the case of a convex corner, the intersection of the triangle with the simulated shape results in a pass condition as reflected in block 1108. Conversely, for a concave corner, the absence of intersection between the triangle drawn at the ground rule size and the shape results in the pass condition at block 1108.

In case of a fail, the process flow proceeds to blocks 1110a and 1112a for convex shapes or to blocks 1110b and 1112b for concave shapes. In either instance, successively larger triangle are drawn until the appropriate exit condition is met; i.e., for a convex shape, an intersection is finally detected, and for a concave shape, an intersection is no longer detected. At this point, the process reaches block 1114 where it is determined that the (failed) corner rounding is somewhere between the current triangle size and the previous triangle size. Finally, the degree to which the shape corner rounding has failed is quantified as shown in block 1116 and saved for future analysis.

Figure 12:
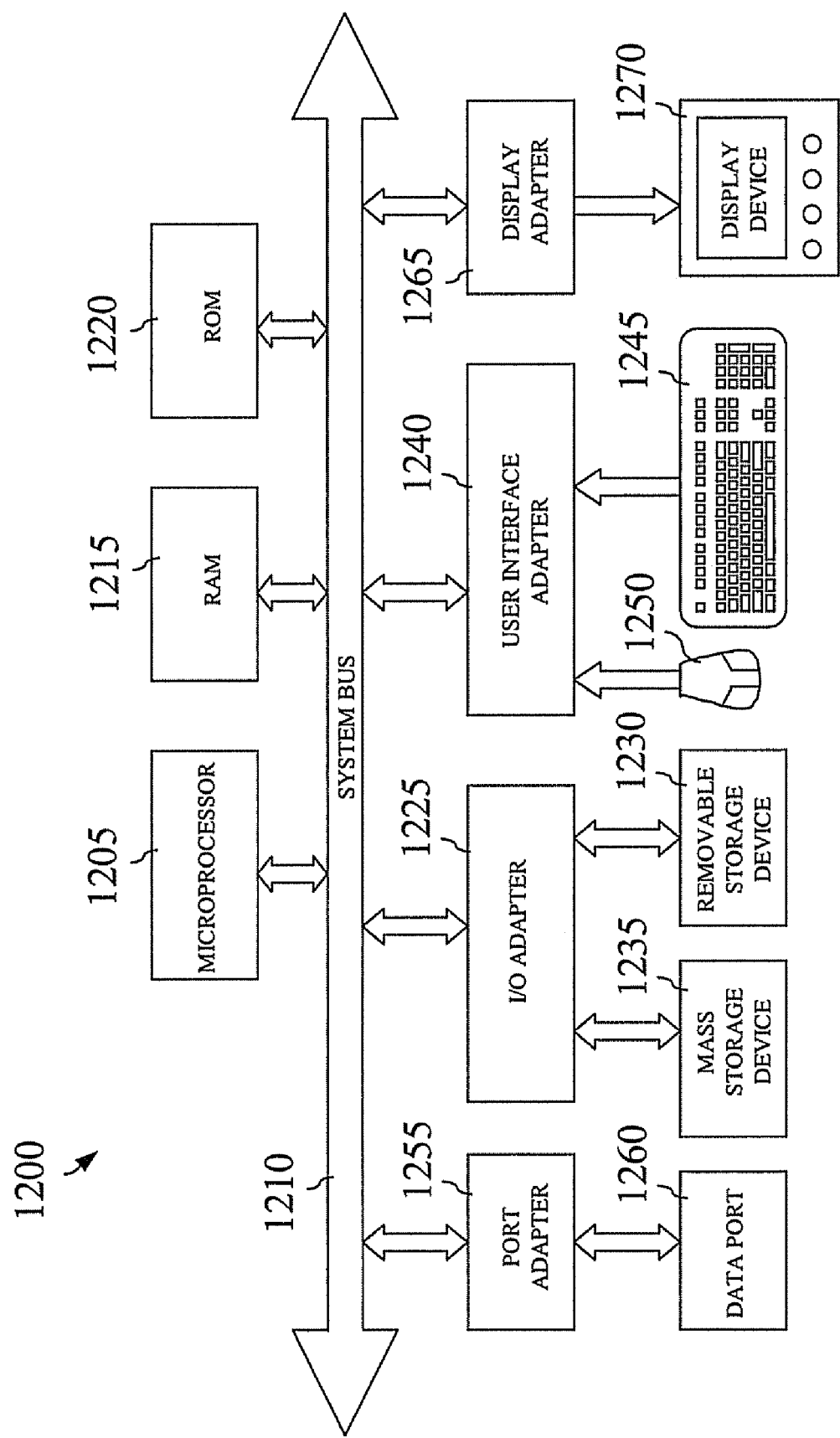
FIG. 12 is a schematic block diagram of a general-purpose computer suitable for practicing embodiments of the present invention.

Generally, the method embodiments for implementing optical rule checking to identify and quantify corner rounding errors may be practiced with a general-purpose computer and the method may be coded as a set of instructions on removable or hard media for use by the general-purpose computer. FIG. 12 is a schematic block diagram of a general-purpose computer suitable for practicing embodiments of the present invention. In FIG. 12, computer system 1200 has at least one microprocessor or central processing unit (CPU) 1205. CPU 1205 is interconnected via a system bus 1210 to a random access memory (RAM) 1215, a read-only memory (ROM) 1220, an input/output (I/O) adapter 1225 for a connecting a removable data and/or program storage device 1230 and a mass data and/or program storage device 1235, a user interface adapter 1240 for connecting a keyboard 1245 and a mouse 1250, a port adapter 1255 for connecting a data port 1260 and a display adapter 1265 for connecting a display device 1270.

ROM 1220 contains the basic operating system for computer system 1200. The operating system may alternatively reside in RAM 1215 or elsewhere as is known in the art. Examples of removable data and/or program storage device 1230 include magnetic media such as floppy drives and tape drives and optical media such as CD ROM drives. Examples of mass data and/or program storage device 1235 include hard disk drives and non-volatile memory such as flash memory. In addition to keyboard 1245 and mouse 1250, other user input devices such as trackballs, writing tablets, pressure pads, microphones, light pens and position-sensing screen displays may be connected to user interface 1240. Examples of display devices include cathode-ray tubes (CRT) and liquid crystal displays (LCD).

A computer program with an appropriate application interface may be created by one of skill in the art and stored on the system or a data and/or program storage device to simplify the practicing of this invention. In operation, information for or the computer program created to run the present invention is loaded on the appropriate removable data and/or program storage device 1230, fed through data port 1260 or typed in using keyboard 1245.

In view of the above, the present method embodiments may therefore take the form of computer or controller implemented processes and apparatuses for practicing those processes. The disclosure can also be embodied in the form of computer program code containing instructions embodied in tangible media, such as floppy diskettes, CD-ROMs, hard drives, or any other computer-readable storage medium, wherein, when the computer program code is loaded into and executed by a computer or controller, the computer becomes an apparatus for practicing the invention. The disclosure may also be embodied in the form of computer program code or signal, for example, whether stored in a storage medium, loaded into and/or executed by a computer or controller, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits. A technical effect of the executable instructions is to implement the exemplary method described above and illustrated in FIGS. 3, 10 and 11.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for implementing optical rule checking (ORC) to identify and quantify corner rounding errors, the method comprising:
using a computer for:
receiving ORC corner rounding data based on established ground rules;
determining a simulated shape for a semiconductor device feature produced on a wafer, the simulated shape based on a designed shape for the semiconductor device feature;
selecting a corner feature associated with the designed shape, and drawing one or more triangles at the selected corner feature;
for each drawn triangle, determining the presence or absence of an intersection between the triangle and the simulated shape, wherein a degree of corner rounding is determined by a pair of successively sized triangles for which one of the pair intersects with the simulated shape and the other of the pair does not intersect with the simulated shape;
determining an approximate corner rounding; and
comparing the determined approximate corner rounding with the ground rule based ORC corner rounding data for the designed shape to determine whether the simulated shape results in a corner rounding rule violation.

2. The method of claim 1, wherein the comparing the determined corner rounding with the ground rule based ORC corner rounding data for the designed shape comprises drawing a first of the triangles at a size corresponding to a maximum allowable degree of rounding based on the ORC corner rounding data such that the presence or absence of an intersection between the first triangle and the simulated shape immediately determines whether the simulated shape results in a corner rounding rule violation.

3. The method of claim 2, wherein for a simulated shape determined to result in a corner rounding error after drawing of the first triangle, subsequently drawing the successively sized triangles until the degree of corner rounding is determined so as to quantify the extent of the corner rounding rule violation.

4. The method of claim 3, wherein each successively sized triangle is drawn larger than the previously drawn triangle.

5. The method of claim 2, wherein for a convex corner, a non-intersection between the first triangle and the simulated shape represents a corner rounding rule violation and for a concave corner, an intersection between the first triangle and the simulated shape represents a corner rounding rule violation.

6. The method of claim 1, further comprising drawing a first of the triangles at a smallest definable size, wherein each successively sized triangle is drawn larger than the previously drawn triangle.

7. The method of claim 6, wherein the determination of whether the simulated shape results in a corner rounding rule violation is performed subsequent to the determination of the degree of corner rounding of the simulated shape.

8. A computer program product, comprising:
a computer readable computer program code within a storage device for implementing optical rule checking (ORC) to identify and quantify corner rounding errors; and
instructions for causing a computer to implement a method, the method further comprising:
receiving ORC corner rounding data based on established ground rules;
determining a simulated shape for a semiconductor device feature produced on a wafer, the simulated shape based on a designed shape for the semiconductor device feature;
selecting a corner feature associated with the designed shape, and drawing one or more triangles at the selected corner feature;
for each drawn triangle, determining the presence or absence of an intersection between the triangle and the simulated shape, wherein a degree of corner rounding is determined by a pair of successively sized triangles for which one of the pair intersects with the simulated shape and the other of the pair does not intersect with the simulated shape;
determining an approximate corner rounding; and
comparing the determined approximate corner rounding with the ground rule based ORC corner rounding data for the designed shape to determine whether the simulated shape results in a corner rounding rule violation.

9. The computer program product of claim 8, wherein the comparing the determined corner rounding with the ground rule based ORC corner rounding data for the designed shape comprises drawing a first of the triangles at a size corresponding to a maximum allowable degree of rounding based on the ORC corner rounding data such that the presence or absence of an intersection between the first triangle and the simulated shape immediately determines whether the simulated shape results in a corner rounding rule violation.

10. The computer program product of claim 9, wherein for a simulated shape determined to result in a corner rounding error after drawing of the first triangle, subsequently drawing the successively sized triangles until the degree of corner rounding is determined so as to quantify the extent of the corner rounding rule violation.

11. The computer program product of claim 10, wherein each successively sized triangle is drawn larger than the previously drawn triangle.

12. The computer program product of claim 9, wherein for a convex corner, a non-intersection between the first triangle and the simulated shape represents a corner rounding rule violation and for a concave corner, an intersection between the first triangle and the simulated shape represents a corner rounding rule violation.

13. The computer program product of claim 8, wherein the method further comprising drawing a first of the triangles at a smallest definable size, wherein each successively sized triangle is drawn larger than the previously drawn triangle.

14. The computer program product of claim 13, wherein the determination of whether the simulated shape results in a corner rounding rule violation is performed subsequent to the determination of the degree of corner rounding of the simulated shape.

15. A system for implementing optical rule checking (ORC) to identify and quantify corner rounding errors, comprising:
a computing network including a processing device in communication with one or more computer memory storage devices; and
the computing network further configured to implement a method for optical rule checking (ORC) to identify and quantify corner rounding errors, the method further comprising:
receiving ORC corner rounding data based on established ground rules;
determining a simulated shape for a semiconductor device feature produced on a wafer, the simulated shape based on a designed shape for the semiconductor device feature;
selecting a corner feature associated with the designed shape, and drawing one or more triangles at the selected corner feature;
for each drawn triangle, determining the presence or absence of an intersection between the triangle and the simulated shape, wherein a degree of corner rounding is determined by a pair of successively sized triangles for which one of the pair intersects with the simulated shape and the other of the pair does not intersect with the simulated shape;
determining an approximate corner rounding; and
comparing the determined approximate corner rounding with the ground rule based ORC corner rounding data for the designed shape to determine whether the simulated shape results in a corner rounding rule violation.

16. The system of claim 15, wherein the comparing the determined corner rounding with the ground rule based ORC corner rounding data for the designed shape comprises drawing a first of the triangles at a size corresponding to a maximum allowable degree of rounding based on the ORC corner rounding data such that the presence or absence of an intersection between the first triangle and the simulated shape immediately determines whether the simulated shape results in a corner rounding rule violation.

17. The system of claim 16, wherein for a simulated shape determined to result in a corner rounding error after drawing of the first triangle, subsequently drawing the successively sized triangles until the degree of corner rounding is determined so as to quantify the extent of the corner rounding rule violation.

18. The system of claim 17, wherein each successively sized triangle is drawn larger than the previously drawn triangle.

19. The system of claim 16, wherein for a convex corner, a non-intersection between the first triangle and the simulated shape represents a corner rounding rule violation and for a concave corner, an intersection between the first triangle and the simulated shape represents a corner rounding rule violation.

20. The system of claim 15, wherein the method further comprising drawing a first of the triangles at a smallest definable size, wherein each successively sized triangle is drawn larger than the previously drawn triangle.

21. The system of claim 20, wherein the determination of whether the simulated shape results in a corner rounding rule violation is performed subsequent to the determination of the degree of corner rounding of the simulated shape.

* * * * *